(12) United States Patent
Ryu et al.

(10) Patent No.: US 9,530,830 B2
(45) Date of Patent: Dec. 27, 2016

(54) ORGANIC ELECTROLUMINESCENT DEVICE

(71) Applicant: LG Display Co., Ltd., Seoul (KR)

(72) Inventors: Won-Sang Ryu, Gyeonggi-do (KR); Sang-Soon Noh, Gyeonggi-do (KR); Dong-Chae Shin, Gyeonggi-do (KR); Sun-Young Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/745,684

(22) Filed: Jun. 22, 2015

(65) Prior Publication Data

US 2016/0005803 A1    Jan. 7, 2016

(30) Foreign Application Priority Data

Jul. 3, 2014  (KR) .......................... 10-2014-0083164

(51) Int. Cl.
*H01L 27/32*   (2006.01)
*H01L 51/52*   (2006.01)

(52) U.S. Cl.
CPC ....... *H01L 27/3265* (2013.01); *H01L 27/3248* (2013.01); *H01L 27/3258* (2013.01); *H01L 51/5253* (2013.01); *H01L 27/3272* (2013.01); *H01L 2251/5338* (2013.01)

(58) Field of Classification Search
CPC ................................................. H01L 27/3265
See application file for complete search history.

(56) References Cited

U.S. PATENT DOCUMENTS

| 6,046,547 | A | * | 4/2000 | Nishio | .................... | G09G 3/30 |
| | | | | | | 313/500 |
| 2002/0104995 | A1 | | 8/2002 | Yamazaki et al. | | |
| 2014/0291635 | A1 | * | 10/2014 | Cho | ................. | H01L 29/78618 |
| | | | | | | 257/40 |

FOREIGN PATENT DOCUMENTS

EP      0 849 721 A2    6/1998

OTHER PUBLICATIONS

European Search Report issued in corresponding European Patent Application No. 15172659.3 dated Nov. 24, 2015.

* cited by examiner

*Primary Examiner* — Lex Malsawma
(74) *Attorney, Agent, or Firm* — Morgan, Lewis & Bockius LLP

(57) ABSTRACT

Disclosed is an organic electroluminescent device (OELD) includes a first substrate including a pixel region that includes an element region and a light emission region; a storage capacitor disposed at the element region, and including a first storage electrode, a first buffer layer on the first storage electrode, and a second storage electrode on the first buffer layer; a second buffer layer on the storage capacitor; a plurality of TFTs on the second buffer layer at the element region; and a passivation layer on the plurality of TFTs, wherein the storage capacitor overlaps at least one of the plurality of TFTs.

17 Claims, 4 Drawing Sheets

ORGANIC ELECTROLUMINESCENT DEVICE

The present application claims the priority benefit of Korean Patent Application No. 10-2014-0083164 filed in Republic of Korea on Jul. 3, 2014, which is hereby incorporated by reference in its entirety for all purposes as if fully set forth herein.

BACKGROUND OF THE INVENTION

Field of the Invention

The present invention relates to an organic electroluminescent device (OELD). In particular, the present invention relates to an OELD that can improve a capacitance of a storage capacitor and an aperture ratio of a pixel region, and implement a high resolution.

Discussion of the Related Art

Recently, facing information society, display field of displaying electric information signals has been rapidly advanced, and accordingly, various flat display devices have been developed and used.

As flat display devices, a liquid crystal display device (LCD), a plasma display panel device (PDP), a field emission display device (FED), an electroluminescent display device (ELD) and the like are used. Because these flat display devices have excellent performances of thin profile, lightweight and low power consumption, and the display devices have been rapidly substituted for convention cathode ray tubes (CRTs).

Among the flat display devices, organic electroluminescent devices (OLEDs) have properties of high brightness and low driving voltage.

Further, the OELD can have high contrast ratio and very thin profile because of self-luminescent device, is easy to display moving images with response speed of about several microseconds, has no limit of viewing angles, is stable at low temperature, and has driving circuit easily manufactured and designed because of low driving voltage of DC 5V to 15V.

Accordingly, the OELD having the above advantages are used for various IT devices such as TV, monitor, mobile phone or the like.

The OELD is categorized into a passive matrix type and an active matrix type. A passive matrix type OELD has scan lines and signal lines crossing each other to form devices in a matrix form, and the scan lines are sequentially driven according to times to drive each pixel, and thus in order to realize an average brightness as required, an instant brightness as many as the average brightness multiplied by a number of lines is needed.

However, in an active matrix type OELD, a thin film transistor (TFT) as a switching element to turn on/off a pixel is formed in each pixel region, a first electrode connected to the TFT is turned on/off in each pixel region, and a second electrode facing the first electrode becomes a common electrode.

Further, in the active matrix type OELD, a voltage applied to the pixel region is charged in a storage capacitor and maintained until a signal of a next frame is applied, and thus each pixel continues to be driven for one frame irrespective of a number of scan lines.

Accordingly, even though a low current is applied, the same brightness is emitted, and thus there are advantages of low power consumption, high precision and large size. Thus, recently, the active matrix type OELD has been widely used.

FIG. 1 is a cross-sectional view illustrating an OELD according to the related art.

For the purpose of explanations, a region of a pixel region P where a switching TFT (not shown), a driving TFT DTr are formed is referred to as an element region DA, and a region of the pixel region P where a storage capacitor StgC is formed is referred to as a storage region StgA.

With reference to FIG. 1, a semiconductor layer 13 which includes a first region 13a of an intrinsic poly silicon and second regions 13b doped with impurities, a gate insulating layer 16, a gate electrode 21, an inter-layered insulating layer 23 having a semiconductor contact hole 25 exposing each second region 13b, and source and drain electrodes 33 and 36 are sequentially located on a first substrate 10 to form a driving TFT DTr, and the source and drain electrodes 33 and 36 are connected with a power line (not shown) and a organic light emitting diode E, respectively.

The organic light emitting diode E includes first and second electrodes 47 and 63 facing each other, and an organic light emission layer 60 therebetween. The first electrode 47 contacts an electrode of the driving TFT DTr in each pixel region, and the second electrode 63 is formed entirely on the organic light emission layer 60.

A storage capacitor StgC is formed in each pixel region to maintain a video signal until a next video signal is input.

Regarding a structure of the storage capacitor StgC, a first storage electrode 15 made of doped poly silicon is formed at the same layer as the semiconductor layer 13, the gate insulating layer 16 functioning as a dielectric layer is formed on the first storage electrode 15, and a second storage electrode 18 made of the same material as the gate electrode 21 is formed on the gate insulating layer 16, thereby forming a first storage capacitor StgC1.

Further, the inter-layered insulating layer 23 is formed on the second storage electrode 18, a power line (not shown) is formed on the inter-layered insulating layer 23, and a part of the power line on the inter-layered insulating layer 23 forms a third storage electrode 38. Accordingly, the second storage electrode 18, the inter-layered insulating layer 23 and the third storage electrode 38 forms a second storage capacitor StgC2.

Accordingly, the related art OELD 1 includes the first storage capacitor StgC1 and the second storage capacitor StgC2 connected in parallel with each other, and has a storage capacitance which is a sum of a storage capacitance of the first storage capacitor StgC1 and a storage capacitance of the second storage capacitor StgC2.

Recently, a high resolution of a display device has been rapidly required.

A resolution of a display device is defined as a PPI (pixel per inch), a high-resolution display device means a display device having 300 PPI or more. Further, recently, a display device having a super resolution of 500 PPI or more is required.

To realize a super resolution, a number of pixel regions per a unit area should increase, and this means that a size of each pixel region is reduced.

When a size of a pixel region is reduced, components constituting the pixel region are also reduced, and thus an area of a storage capacitor is reduced. This causes reduction of a storage capacitance.

Further, when a size of a pixel region is reduced, a size of an organic light emitting layer is reduced, and a storage capacitance is reduced accordingly but is not proportional.

In other words, because a reduction of a storage capacitance due to a size reduction of a storage capacitor is greater than a reduction of a pixel region, an area to form a storage capacitor in a pixel region is required to more increase.

Further, when an area of a storage capacitor increases in a pixel region, an area of a storage capacitor more increases relatively, and thus aperture ratio is reduced.

A flexible OELD has a flexibility using a plastic film instead of a glass substrate, thus the flexible OELD has light weight and high shock resistance, and can be manufactured in various forms because the OLED can be curved or bent. Accordingly, a flexible OELD has been researched recently.

However, a flexible substrate made of a plastic film is weak to contact with moisture and oxygen compared with a glass substrate. Accordingly, due to moisture and oxygen gradually permeating the flexible substrate, a flexibility of the flexible substrate is damaged or an internal circuit of the flexible substrate is damaged.

Further, the flexible substrate is prone to be charged due to static electricity, and due to an induced electric field, a TFT malfunctions and display quality is degraded thus.

SUMMARY OF THE INVENTION

Accordingly, the present invention is directed to an OLED that substantially obviates one or more of the problems due to limitations and disadvantages of the related art.

An object of the present invention is to improve a capacitance of a storage capacitor and to improve an aperture ratio without an area increase of a storage capacitor.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present invention, as embodied and broadly described herein, an organic electroluminescent device (OELD) includes a first substrate including a pixel region that includes an element region and a light emission region; a storage capacitor disposed at the element region, and including a first storage electrode, a first buffer layer on the first storage electrode, and a second storage electrode on the first buffer layer; a second buffer layer on the storage capacitor; a plurality of TFTs on the second buffer layer at the element region; and a passivation layer on the plurality of TFTs, wherein the storage capacitor overlaps at least one of the plurality of TFTs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE ILLUSTRATED EMBODIMENTS

Reference will now be made in detail to embodiments, examples of which are illustrated in the accompanying drawings. The same or like reference numbers may be used throughout the drawings to refer to the same or like parts.

Figure 2:
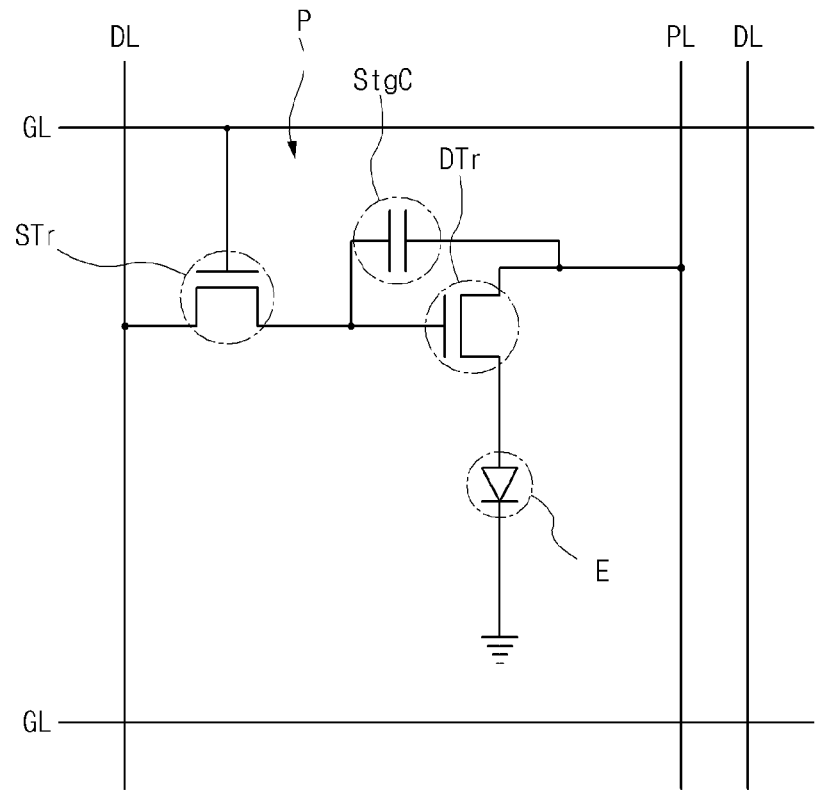
FIG. 2 is a circuit diagram of a pixel region of an OELD according to the present invention.

FIG. 2 is a circuit diagram of a pixel region of an OELD according to the present invention.

With reference to FIG. 2, a pixel region P of the OELD of the present invention includes a gate line GL, a data line DL, a power line PL, a switching TFT STr, a driving TFT DTr, a storage capacitor StgC, and an organic light emitting diode E.

In more detail, the gate lines GL extend along a first direction and are spaced apart from one another, and the data lines DL extend along a second direction crossing the first direction and are spaced apart from one another. The power line PL is spaced apart from the data line DL and supplies a power voltage.

A pixel region P is defined as a region surrounded by the gate lines GL and the data lines DL.

In each pixel region P, the switching TFT STr is formed at the crossing portion of the gate line GL and the data line DL, and the driving TFT DTr is electrically connected to the switching TFT STr.

A first electrode as an end terminal of the organic light emitting diode E is connected to a drain electrode of the driving TFT DTr, and a second electrode as the other end terminal of the organic light emitting diode E is connected to a ground terminal Accordingly, the power voltage of the power line PL is transferred to the organic light emitting diode E when the driving TFT DTr is turned on.

The storage capacitor StgC is connected between a gate electrode and a source electrode of the driving TFT DTr.

When a gate signal is applied through the gate line GL, the switching TFT STr is turned on, and a signal of the data line DL is transferred to the gate electrode of the driving TFT DTr. Accordingly, the driving TFT DTr is turned on, and the organic light emitting diode E emits light.

When the driving TFT DTr is turned on, a level of a current flowing to the organic light emitting diode E from the power line PL is determined, and thus the organic light emitting diode E can implement gray scales.

Further, the storage capacitor StgC functions to maintain a gate voltage of the driving TFT DTr when the switching TFT STr is turned off. Accordingly, even though the switching TFT STr is in a turn-off state, a level of a current flowing to the organic light emitting diode E can be maintained until a next frame.

Hereinafter, embodiments of configurations of OELD according to the present invention are explained.

<First Embodiment>

Figure 3:
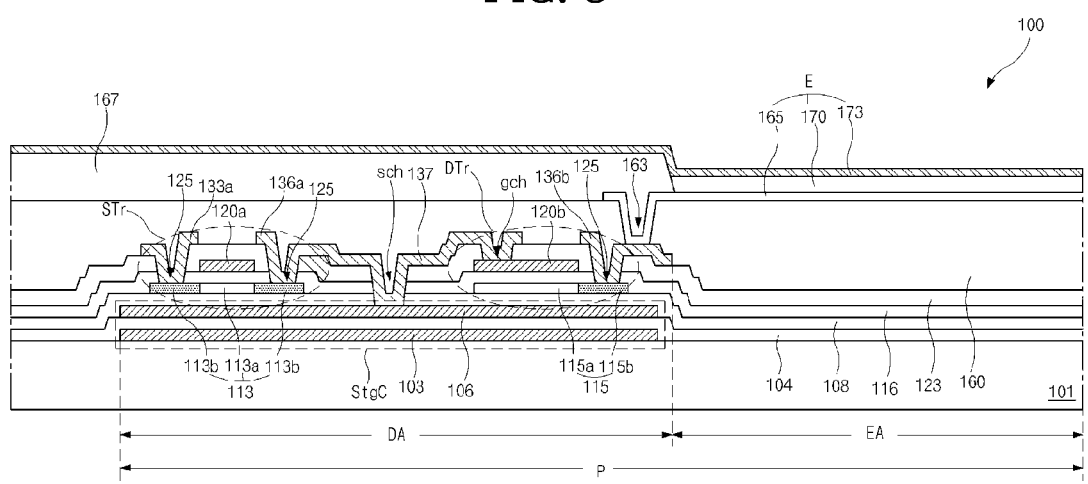
FIG. 3 is a cross-sectional view illustrating a pixel region of an OELD according to a first embodiment of the present invention.

FIG. 3 is a cross-sectional view illustrating a pixel region of an OELD according to a first embodiment of the present invention.

For the purpose of explanations, a region of a pixel region P where a switching TFT STr, a driving TFT DTr and a storage capacitor StgC are formed is referred to as an element region DA, and a region of the pixel region P where an organic light emitting diode E is formed is referred to as an emission region EA. Further, respective regions of the element region DA where the switching TFT STr and the driving TFT DTr are formed are referred to as a switching region and a driving region.

With reference to FIG. 3, the OELD 101 of the first embodiment includes a first substrate 101 having the switching TFT STr, the driving TFT DTr, the storage capacitor StgC and the organic light emitting diode E thereon, and a second substrate (not shown) for encapsulation.

On the first substrate 101, a first storage electrode 103 made of a metal material is formed corresponding to each element region DA.

A first buffer layer 104 is formed on the first storage electrode 103 and may be made of an inorganic insulating material, for example, silicon oxide ($SiO_2$) or silicon nitride (SiNx). It is preferred, but not limited, that the first buffer layer 104 has a thickness of about 1000 angstroms to 4000 angstroms.

The first buffer layer 104 is one component that constitutes the storage capacitor StgC and functions as a dielectric layer, and a thickness of the dielectric layer is a factor determining a capacitance of the storage capacitance StgC.

In other words, as a thickness of the first buffer layer 104 becomes greater, a capacitance of the storage capacitor StgC becomes lesser, and on the contrary, as a thickness of the first buffer layer 104 becomes lesser, a capacitance of the storage capacitor StgC becomes greater.

Accordingly, in order that the storage capacitor StgC has a great capacitance, the first buffer layer 104 more preferably has a thickness of about 500 angstroms to about 3000 angstroms.

Figure 1:
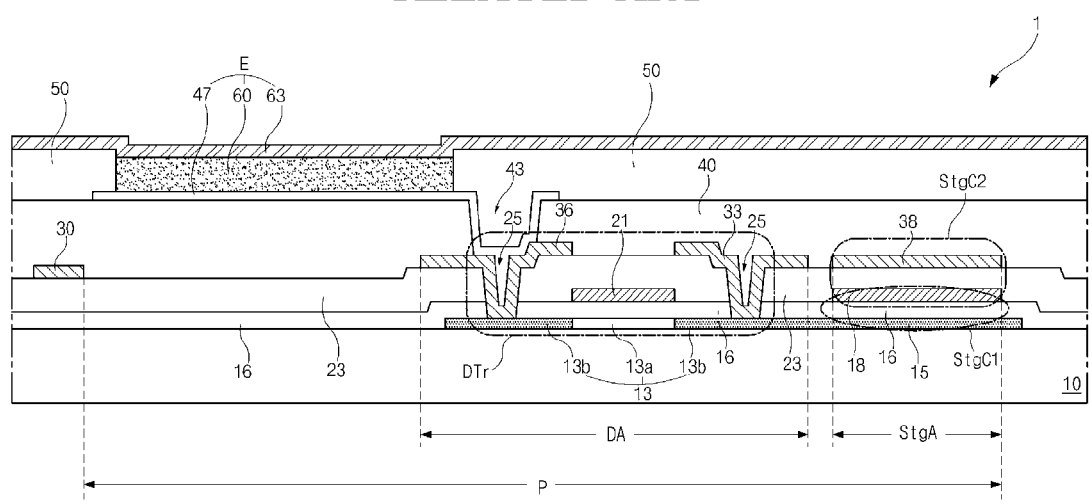
FIG. 1 is a cross-sectional view illustrating an OELD according to the related art.

In the related art OELD (1 of FIG. 1), the gate insulating layer (16 of FIG. 1) or the inter-layered insulating layer (23 of FIG. 1) functions as a dielectric layer. However, the gate insulating layer or inter-layered insulating layer has a limit in reducing a thickness thereof because the gate insulating layer or inter-layered insulating layer functions as the dielectric layer of the storage capacitor (StgC1 or StgC2 of FIG. 1) and as a component of the OLED (i.e., an insulating layer) as well. Accordingly, it is impossible to adjust the thickness of the gate insulating layer or inter-layered insulating layer.

However, in the OELD 100 of the first embodiment, the first buffer layer 104 is a component independently employed to function as a dielectric layer of the storage capacitor StgC. Accordingly, an area of the storage capacitor StgC can be reduced by forming the first buffer layer 104 using silicon nitride (SiNx) having a dielectric constant higher than silicon oxide ($SiO_2$). Further, a thickness of the first buffer layer 104 can be adjusted as needed, and in this case, by forming the first buffer layer 104 as thin as possible within a range not to cause a fabrication error, a capacitance of the storage capacitor StgC can be maximized.

A second storage electrode 106 made of a metal material is formed on the first buffer layer 104 and overlaps the first storage electrode 103. The first storage electrode 103, the buffer layer 104, and the second storage electrode 106 overlapping one another constitutes the storage capacitor StgC.

Figure 4A:
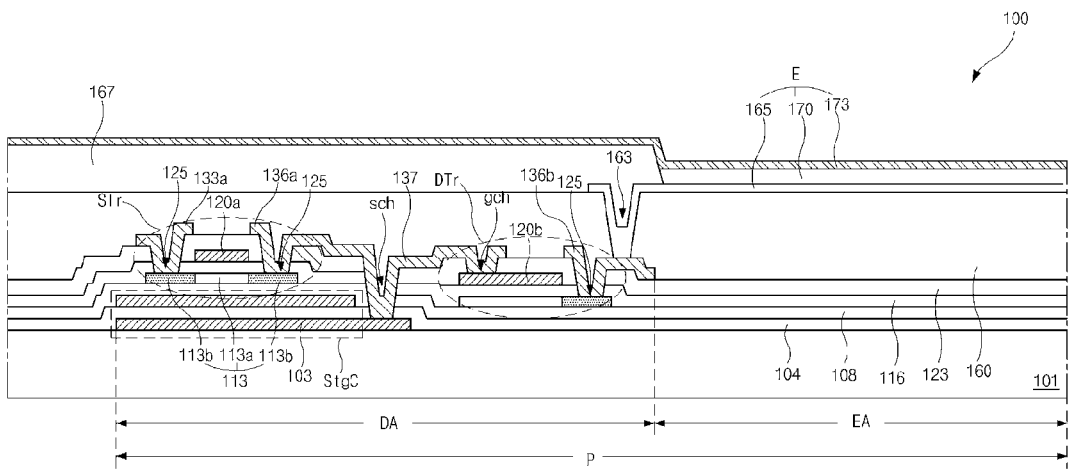
FIGS. 4A and 4B are cross-sectional views illustrating pixel regions of an OELDs according to alternative embodiments of the present invention.
Figure 4B:
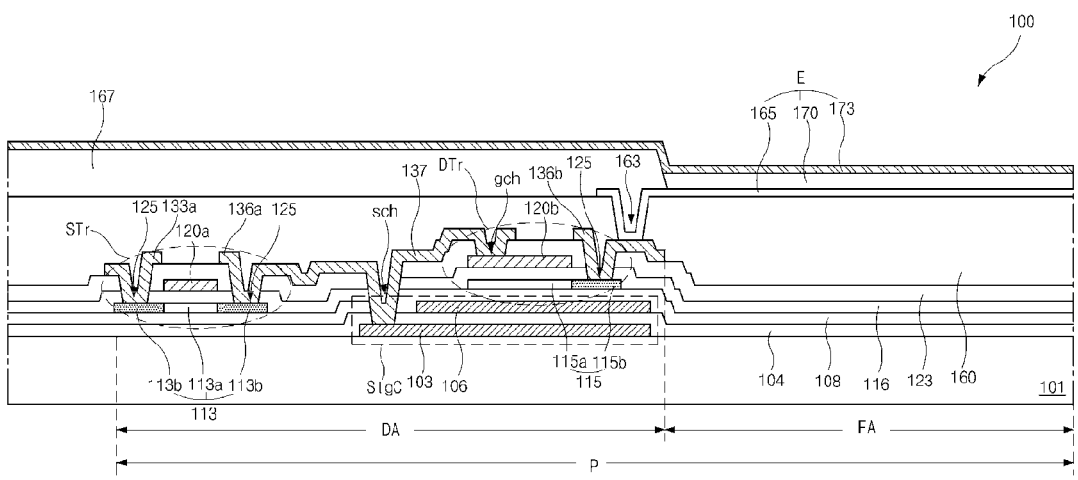

In FIG. 3, it is shown that the storage capacitor StgC is formed substantially all over the switching region and the driving region of each element region DA. In alternative embodiments, as shown in FIGS. 4A and 4B, the storage capacitor StgC may be formed overlapping the switching TFT STr (referring to FIG. 4A), or overlapping the driving TFT DTr (referring to FIG. 4B).

A second buffer layer 108 is formed on the second storage electrode 106 and entirely over the first substrate 101, and may be made of an inorganic insulating material, for example, silicon oxide ($SiO_2$) or silicon nitride (SiNx).

The second buffer layer 108 can function to prevent electric short between the second storage electrode 106 and a poly silicon, and also function to prevent reduction of properties of first and second semiconductor layers 113 and 115 due to emission of alkali ions which come out from the first substrate 101 when crystallizing amorphous silicon to form the first and second semiconductor layers 113 and 115 of poly silicon The first and second semiconductor layers 113 and 115 are formed in the switching and driving regions, respectively, and includes respective first regions 113a and 115a formed at respective center portions and made of intrinsic poly silicon, and respective second regions 113b and 115b formed at respective both side portions and made of poly silicon highly doped with impurities.

Even though not shown in the drawings, the first and second semiconductor layers 113 and 115 may include respective third regions lightly doped with impurities between the first regions 113a and 115a and the second regions 113b and 115b. In other words, the doping concentration of the third regions is less than that of the second regions 113b and 115b. The third region may be referred to as an LDD (lightly doped drain) region.

In the drawings, it is shown that the first and second semiconductor layers 113 and 115 have the respective first regions 113a and 113b and second regions 113b and 115b.

Alternatively, the first and second semiconductor layers 113 and 115 may be each made of an oxide semiconductor material instead of the poly silicon, and the oxide semiconductor material may be one of IGZO (indium gallium zinc oxide), ZTO (zinc tin oxide), ZIO (zinc indium oxide) and ZnO (zinc oxide). When the oxide semiconductor material is used, the second and third regions doped with impurities may not be formed.

A gate insulating layer 116 is formed on the first and second semiconductor layers 113 and 115 and entirely over the first substrate 101, and may be made of an inorganic insulating material, for example, at least one of silicon oxide ($SiO_2$) and silicon nitride (SiNx).

A first gate electrode 120a and a second gate electrode 120b are formed in the switching and driving regions, respectively, and corresponds to the first and second semiconductor layers 113 and 115, respectively, and in more detail, corresponds to the first regions 113a and 113b of the first and second semiconductor layers 113 and 115, respectively.

The first and second gate electrodes 120a and 120b may be formed to each have a single-layered structure using one of low-resistance metal materials, for example, aluminum (Al), aluminum alloy (e.g., AlNd), copper (Cu), copper alloy, molybdenum (Mo) and molybdenum alloy, or to have a multiple-layered structure using at least two of the above-described metal materials.

In the drawings, it is shown that the first and second gate electrodes 120a and 120b each have a single-layered structure.

Even though not shown in the drawings, a gate line is formed of the same material as and at the same layer as the first and second gate electrodes 120a and 120b. The gate line is connected to the first gate electrode 120a and extends along a first direction.

An inter-layered insulating layer 123 is formed on the first and second gate electrodes 120a and 120b and the gate line and entirely over the first substrate 101, and may be made of an inorganic insulating material, for example, silicon oxide ($SiO_2$) or silicon nitride (SiNx).

The inter-layered insulating layer 123 and the gate insulating layer 116 include semiconductor contact holes 125 that expose the second regions 113b of the first semiconductor layer 113 and the second regions 115b of the second semiconductor layer 115. Further, the inter-layered insulating layer 123, the gate insulating layer 116 and the second buffer layer 108 include a storage contact hole sch that exposes the second storage electrode 106. Further, the inter-layered insulating layer 123 includes a gate contact hole gch that exposes the second gate electrode 120b.

In the alternative embodiments shown FIGS. 4A and 4B, a storage contact hole sch is formed in the inter-layered insulating layer 123, the gate insulating layer 116 and the second buffer layer 108 and further the first buffer layer 104 to expose the first storage electrode 103.

When the first and second semiconductor layers 113 and 115 are made of an oxide semiconductor material, the semiconductor contact holes 125 exposes both sides of each of the first and second semiconductor layers 113 and 115.

A first source electrode 133a and a first drain electrode 136a, which contact the corresponding second regions 113b of the first semiconductor layer 113 through the corresponding semiconductor contact holes 125, and a second source electrode (not shown) and a second drain electrode 136b, which contact the corresponding second regions 115b of the second semiconductor layer 115 through the corresponding semiconductor contact holes 125, are formed on the inter-layered insulating layer 123.

When the first and second semiconductor layers 113 and 115 are made of an oxide semiconductor material, the first source electrode 133a and the first drain electrode 136a contacts the corresponding both side regions of the first semiconductor layer 113, and the second source electrode and the second drain electrode 136b contacts the corresponding both side regions of the second semiconductor layer 115.

A first auxiliary pattern 137 is also formed on the inter-layered insulating layer 123, and contacts the second gate electrode 120b through the gate contact hole gch, and is connected to the first drain electrode 136a.

Even though not shown in the drawings, a data line which is connected to the first source electrode 133a and extends along a second direction crossing the first direction, and a power line which is parallel with the data line and connected to the second source electrode are formed on the inter-layered insulating layer 123.

The first source electrode 133a, the first drain electrode 136a, the second source electrode, the second drain electrode 136b, the data line, and the power line may be formed to each have a single-layered structure using one of low-resistance metal materials, for example, aluminum (Al), aluminum alloy (e.g., AlNd), copper (Cu), copper alloy, molybdenum (Mo) and molybdenum alloy, or to have a multiple-layered structure using at least two of the above-described metal materials.

In the drawings, it is shown that the first source electrode 133a, the first drain electrode 136a, the second source electrode, the second drain electrode 136b, the data line, and the power line each have a single-layered structure.

The first semiconductor layer 113, the gate insulating layer 116, the first gate electrode 120a, the inter-layered insulating layer 123, the first source electrode 133a, and the first drain electrode 136a sequentially located in the switching region constitutes the switching TFT STr. The second semiconductor layer 115, the gate insulating layer 116, the second gate electrode 120b, the inter-layered insulating layer 123, the second source electrode, and the second drain electrode 136b sequentially located in the driving region constitutes the driving TFT DTr.

A passivation layer 160 is formed on the first source electrode 133a, the first drain electrode 136a, the second source electrode, the second drain electrode 136b, the data line, and the power line, and may be made of an organic insulating material, for example, photo acryl, or an inorganic insulating material, for example, silicon oxide ($SiO_2$) or silicon nitride (SiNx).

The passivation layer 160 includes a drain contact hole 163 exposing the second drain electrode 136b.

In the drawings, the passivation layer 160 is made of an organic insulating layer so that a surface of the passivation layer 160 is substantially flat.

A first electrode 165 is formed on the passivation layer 160 in the emission region EA of each pixel region P, and is connected to the second drain electrode 136b through the drain contact hole 163.

The first electrode 165 may be made of a transparent conductive material having a relative high work function, for example, ITO (indium tin oxide) so that the first electrode 165 functions as an anode. Alternatively, the first electrode 165 made be made of a metal material having a relative low work function, for example, at least one of aluminum (Al), aluminum-neodymium alloy (AlNd), silver (Ag), magnesium (Mg), gold (Au), and aluminum-magnesium alloy (AlMg) so that the first electrode 165 functions as a cathode.

A bank 167 is formed on the first electrode 165 and at a boundary of the emission region EA. The bank 167 surrounds the emission region EA, overlaps edge portions of the first electrode 165, and exposes a center portion of the first electrode 165.

The bank 167 may be made of a transparent organic insulating material, for example, polyimide, or a black organic insulating material, for example, black resin.

An organic light emission layer 170 is formed on the first electrode 167 at the emission region EA surrounded by the bank 167. A second electrode 173 is formed on the organic light emission layer 170 and the bank 167 and entirely over a display region.

The first and second electrodes 165 and 173, and the organic light emission layer 170 therebetween constitutes an organic light emitting diode E.

Even though not shown in the drawings, a first light emission compensation layer may be formed between the first electrode 165 and the organic light emission layer 170 and may have a single-layered or multiple-layered structure. Further, a second light emission compensation layer may be formed between the second electrode 173 and the organic light emission layer 170 and may have a single-layered or multiple-layered structure.

When the first electrode 165 functions as an anode, the first light emission compensation layer may have a multiple-layered structure that includes a hole injection layer and a hole transporting layer sequentially located on the first electrode 165, and the second light emission compensation layer may have a multiple-layered structure that includes an electron transporting layer and an electron injection layer sequentially located on the organic light emission layer 170.

Alternatively, the first light emission compensation layer may have a single-layered structure of a hole injection layer or hole transporting layer, and the second light emission compensation layer may have a single-layered structure of an electron injection layer or electron transporting layer.

The first light emission compensation layer may further include an electron blocking layer, and the second light emission compensation layer may further include a hole blocking layer.

When the first electrode 165 functions as a cathode, the above positions of the first light emission compensation layer and the second light emission compensation layer change.

When the first electrode 165 functions as an anode, the second electrode 173 may be made of a metal material having a relative low work function, for example, at least one of aluminum (Al), aluminum-neodymium alloy (AlNd), silver (Ag), magnesium (Mg), gold (Au), and aluminum-magnesium alloy (AlMg) so that the second electrode 173 functions as a cathode. When the first electrode 165 functions as a cathode, the second electrode 173 may be made of a transparent conductive material having a relative high work function, for example, ITO so that the second electrode 173 functions as an anode.

The second substrate as an encapsulation substrate is employed to face the first substrate 101 having the above components.

The first substrate 101 and the second substrate may be attached to each other using an adhesive material made of sealant or frit to form an OELD panel, and the adhesive material are located along peripheral portions of the first substrate 101 and the second substrate. Further, a space between the first substrate 101 and the second substrate may be filled with a vacuum or inert gas.

The second substrate may be made of a plastic material having a flexibility, or a glass material.

Alternatively, the second substrate may be formed in a film type having an adhesive layer, and may contact the second electrode 173 on the first substrate 101.

Alternatively, a capping layer made of an organic insulating material or inorganic insulating material may be further formed on the second electrode 173, and in this case, the capping layer is used for an encapsulation layer and the second substrate for encapsulating may be eliminated.

As described above, the OELD 101 of the first embodiment uses the storage capacitor StgC that is configured to overlap at least one of the switching TFT STr and the driving TFT DTr. Accordingly, the OELD 101 does not need an extra region to form the storage capacitor StgC out of each element region DA.

Thus, an area of the element region DA in each pixel region P can be reduced, and, by utilizing a reduced area of the element region DA for the light emission region EA, an aperture ration can be improved.

Further, since the storage capacitor StgC can be formed all over the element region DA, a capacitance of the storage capacitor StgC can be obtained sufficiently.

Therefore, even though the OELD 101 has a high resolution of 300 PPI or more, degradation of display quality due to reduction of storage capacitance can be prevented.

Further, since the storage capacitor StgC overlaps the switching TFT STr and/or the driving TFT DTr, the storage capacitor StgC functions as a component to shield the first and/or second semiconductor layers 113 and/or 115 from an external light, and thus malfunction of the TFT(s) due to leakage current due to the external light entering the semiconductor layer(s) can be prevented.

<Second Embodiment>

Figure 5:
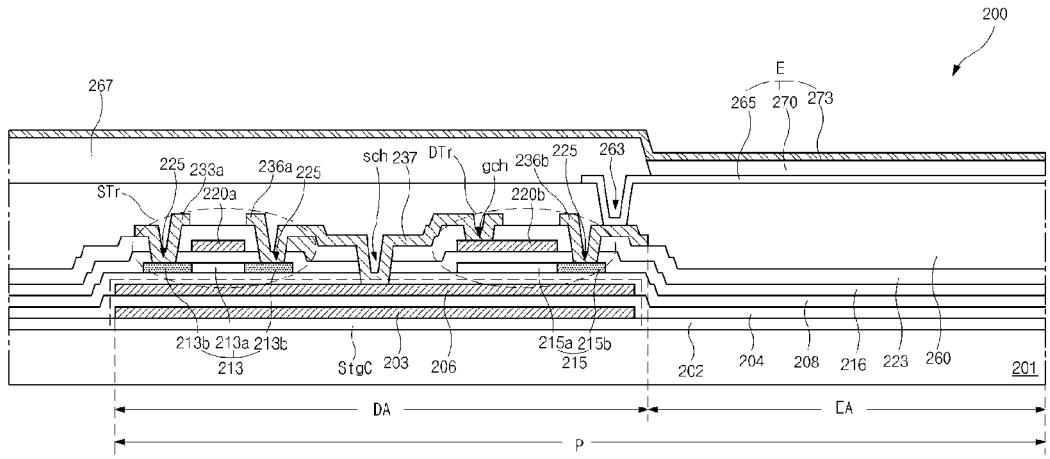
FIG. 5 is a cross-sectional view illustrating a pixel region of an OELD according to a second embodiment of the present invention.

FIG. 5 is a cross-sectional view illustrating a pixel region of an OELD according to a second embodiment of the present invention.

For the purpose of explanations, a region of a pixel region P where a switching TFT STr, a driving TFT DTr and a storage capacitor StgC are formed is referred to as an element region DA, and a region of the pixel region P where an organic light emitting diode E is formed is referred to as an emission region EA. Further, respective regions of the element region DA where the switching TFT STr and the driving TFT DTr are formed are referred to as a switching region and a driving region.

With reference to FIG. 3, the OELD 201 of the second embodiment includes a first substrate 201 having the switching TFT STr, the driving TFT DTr, the storage capacitor StgC and the organic light emitting diode E thereon, and a second substrate (not shown) for encapsulation.

The first substrate 201 may be a glass substrate or flexible substrate. In case of the flexible substrate, the substrate 201 may be made of polyethylene terephthalate (PET), polycarbonate (PC), polyolefin, poly(ether sulfones) (PES) or the like.

When the OELD 201 uses the flexible substrate, since the OELD 201 has flexibility, the OELD 201 can have light weight and high shock resistance, and can be manufactured in various forms.

On the first substrate 201, a moisture blocking layer 202 is formed and may be made of an inorganic insulating material, for example, at least one of silicon oxide ($SiO_2$) and silicon nitride (SiNx).

The first substrate 201 of flexibility is weak in blocking moisture and oxygen compared to a glass substrate, and thus the moisture blocking layer 202 is required.

The moisture blocking layer 202 may have a single-layered or double-layered structure using at least one of silicon oxide ($SiO_2$) and silicon nitride (SiNx). Alternatively, the moisture blocking layer 202 may have a multiple-layered structure using inorganic insulating material and organic insulating material.

A first storage electrode 203 made of a metal material is formed on the moisture blocking layer 202 corresponding to each element region DA.

A first buffer layer 204 is formed on the first storage electrode 203 and may be made of an inorganic insulating material, for example, silicon oxide ($SiO_2$) or silicon nitride (SiNx). It is preferred, but not limited, that the first buffer layer 204 has a thickness of about 2000 angstroms to 4000 angstroms.

The first buffer layer 204 is one component that constitutes the storage capacitor StgC and functions as a dielectric layer, and a thickness of the dielectric layer is a factor determining a capacitance of the storage capacitance StgC.

In other words, as a thickness of the first buffer layer 204 becomes greater, a capacitance of the storage capacitor StgC becomes lesser, and on the contrary, as a thickness of the first buffer layer 204 becomes lesser, a capacitance of the storage capacitor StgC becomes greater.

Accordingly, in order that the storage capacitor StgC has a great capacitance, the first buffer layer 204 more preferably has a thickness of about 500 angstroms to about 3000 angstroms.

In the related art OELD (1 of FIG. 1), the gate insulating layer (16 of FIG. 1) or the inter-layered insulating layer (23 of FIG. 1) functions as a dielectric layer. However, the gate insulating layer or inter-layered insulating layer has a limit in reducing a thickness thereof because the gate insulating layer or inter-layered insulating layer functions as the dielectric layer of the storage capacitor (StgC1 or StgC2 of FIG. 1) and as a component of the OLED (i.e., an insulating layer) as well. Accordingly, it is impossible to adjust the thickness of the gate insulating layer or inter-layered insulating layer.

However, in the OELD 200 of the second embodiment, the first buffer layer 204 is a component independently employed to function as a dielectric layer of the storage capacitor StgC. Accordingly, an area of the storage capacitor StgC can be reduced by forming the first buffer layer 204 using silicon nitride (SiNx) having a dielectric constant higher than silicon oxide (SiO$_2$). Further, a thickness of the first buffer layer 204 can be adjusted as needed, and in this case, by forming the first buffer layer 204 as thin as possible within a range not to cause a fabrication error, a capacitance of the storage capacitor StgC can be maximized.

A second storage electrode 206 made of a metal material is formed on the first buffer layer 204 and overlaps the first storage electrode 203. The first storage electrode 203, the buffer layer 204, and the second storage electrode 206 overlapping one another constitutes the storage capacitor StgC.

Figure 6A:
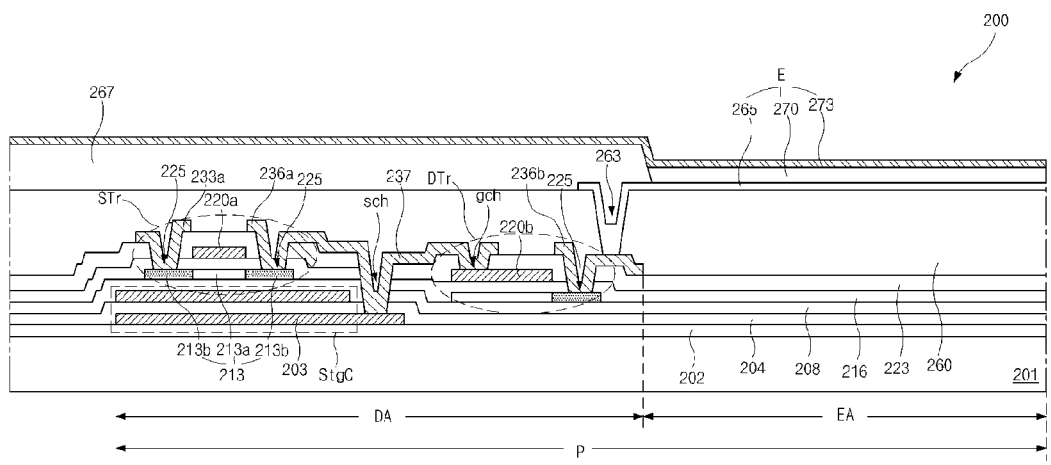
FIGS. 6A and 6B are cross-sectional views illustrating pixel regions of an OELDs according to alternative embodiments of the present invention;.
Figure 6B:
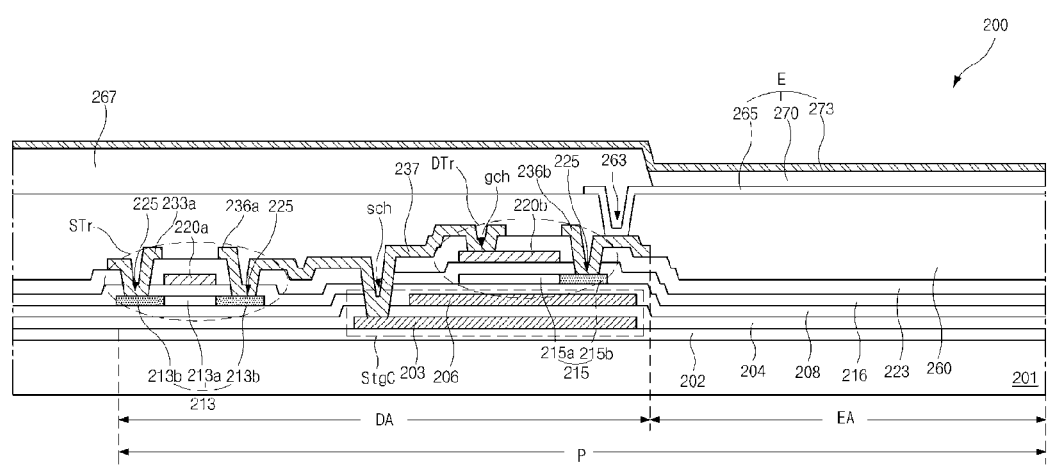

In FIG. 5, it is shown that the storage capacitor StgC is formed substantially all over the switching region and the driving region of each element region DA. In alternative embodiments, as shown in FIGS. 6A and 6B, the storage capacitor StgC may be formed overlapping the switching TFT STr (referring to FIG. 6A), or overlapping the driving TFT DTr (referring to FIG. 6B).

A second buffer layer 208 is formed on the second storage electrode 206 and entirely over the first substrate 201, and may be made of an inorganic insulating material, for example, silicon oxide (SiO$_2$) or silicon nitride (SiNx).

The second buffer layer 208 can function to prevent electric short between the second storage electrode 206 and a poly silicon, and also function to prevent reduction of properties of first and second semiconductor layers 213 and 215 due to emission of alkali ions which come out from the first substrate 201 when crystallizing amorphous silicon to form the first and second semiconductor layers 213 and 215 of poly silicon The first and second semiconductor layers 213 and 215 are formed in the switching and driving regions, respectively, and includes respective first regions 213a and 215a formed at respective center portions and made of intrinsic poly silicon, and respective second regions 213b and 215b formed at respective both side portions and made of poly silicon highly doped with impurities.

Even though not shown in the drawings, the first and second semiconductor layers 213 and 215 may include respective third regions lightly doped with impurities between the first regions 213a and 215a and the second regions 213b and 215b. In other words, the doping concentration of the third regions is less than that of the second regions 213b and 215b. The third region may be referred to as an LDD (lightly doped drain) region.

In the drawings, it is shown that the first and second semiconductor layers 213 and 215 have the respective first regions 213a and 213b and second regions 213b and 215b.

Alternatively, the first and second semiconductor layers 213 and 215 may be each made of an oxide semiconductor material instead of the poly silicon, and the oxide semiconductor material may be one of IGZO (indium gallium zinc oxide), ZTO (zinc tin oxide), ZIO (zinc indium oxide) and ZnO (zinc oxide). When the oxide semiconductor material is used, the second and third regions doped with impurities may not be formed.

A gate insulating layer 216 is formed on the first and second semiconductor layers 213 and 215 and entirely over the first substrate 201, and may be made of an inorganic insulating material, for example, at least one of silicon oxide (SiO$_2$) and silicon nitride (SiNx).

A first gate electrode 220a and a second gate electrode 220b are formed in the switching and driving regions, respectively, and corresponds to the first and second semiconductor layers 213 and 215, respectively, and in more detail, corresponds to the first regions 213a and 213b of the first and second semiconductor layers 213 and 215, respectively.

The first and second gate electrodes 220a and 220b may be formed to each have a single-layered structure using one of low-resistance metal materials, for example, aluminum (Al), aluminum alloy (e.g., AlNd), copper (Cu), copper alloy, molybdenum (Mo) and molybdenum alloy, or to have a multiple-layered structure using at least two of the above-described metal materials.

In the drawings, it is shown that the first and second gate electrodes 220a and 220b each have a single-layered structure.

Even though not shown in the drawings, a gate line is formed of the same material as and at the same layer as the first and second gate electrodes 220a and 220b. The gate line is connected to the first gate electrode 220a and extends along a first direction.

An inter-layered insulating layer 223 is formed on the first and second gate electrodes 220a and 220b and the gate line and entirely over the first substrate 201, and may be made of an inorganic insulating material, for example, silicon oxide (SiO$_2$) or silicon nitride (SiNx).

The inter-layered insulating layer 223 and the gate insulating layer 216 include semiconductor contact holes 225 that expose the second regions 213b of the first semiconductor layer 213 and the second regions 215b of the second semiconductor layer 215. Further, the inter-layered insulating layer 223, the gate insulating layer 216 and the second buffer layer 208 include a storage contact hole sch that exposes the second storage electrode 206. Further, the inter-layered insulating layer 223 includes a gate contact hole gch that exposes the second gate electrode 220b.

In the alternative embodiments shown FIGS. 6A and 6B, a storage contact hole sch is formed in the inter-layered insulating layer 223, the gate insulating layer 216 and the second buffer layer 208 and further the first buffer layer 204 to expose the first storage electrode 203.

When the first and second semiconductor layers 213 and 215 are made of an oxide semiconductor material, the semiconductor contact holes 225 exposes both sides of each of the first and second semiconductor layers 213 and 215.

A first source electrode 233a and a first drain electrode 236a, which contact the corresponding second regions 213b of the first semiconductor layer 213 through the corresponding semiconductor contact holes 225, and a second source electrode (not shown) and a second drain electrode 236b, which contact the corresponding second regions 215b of the second semiconductor layer 215 through the corresponding semiconductor contact holes 225, are formed on the inter-layered insulating layer 223.

When the first and second semiconductor layers 213 and 215 are made of an oxide semiconductor material, the first source electrode 233a and the first drain electrode 236a contacts the corresponding both side regions of the first semiconductor layer 213, and the second source electrode and the second drain electrode 236b contacts the corresponding both side regions of the second semiconductor layer 215.

A first auxiliary pattern 237 is also formed on the inter-layered insulating layer 223, and contacts the second gate electrode 220b through the gate contact hole gch, and is connected to the first drain electrode 236a.

Even though not shown in the drawings, a data line which is connected to the first source electrode 233a and extends along a second direction crossing the first direction, and a power line which is parallel with the data line and connected to the second source electrode are formed on the inter-layered insulating layer 223.

The first source electrode 233a, the first drain electrode 236a, the second source electrode, the second drain electrode 236b, the data line, and the power line may be formed to each have a single-layered structure using one of low-resistance metal materials, for example, aluminum (Al), aluminum alloy (e.g., AlNd), copper (Cu), copper alloy, molybdenum (Mo) and molybdenum alloy, or to have a multiple-layered structure using at least two of the above-described metal materials.

In the drawings, it is shown that the first source electrode 233a, the first drain electrode 236a, the second source electrode, the second drain electrode 236b, the data line, and the power line each have a single-layered structure.

The first semiconductor layer 213, the gate insulating layer 216, the first gate electrode 220a, the inter-layered insulating layer 223, the first source electrode 233a, and the first drain electrode 236a sequentially located in the switching region constitutes the switching TFT STr. The second semiconductor layer 215, the gate insulating layer 216, the second gate electrode 220b, the inter-layered insulating layer 223, the second source electrode, and the second drain electrode 236b sequentially located in the driving region constitutes the driving TFT DTr.

A passivation layer 260 is formed on the first source electrode 233a, the first drain electrode 236a, the second source electrode, the second drain electrode 236b, the data line, and the power line, and may be made of an organic insulating material, for example, photo acryl, or an inorganic insulating material, for example, silicon oxide ($SiO_2$) or silicon nitride (SiNx).

The passivation layer 260 includes a drain contact hole 263 exposing the second drain electrode 236b.

In the drawings, the passivation layer 260 is made of an organic insulating layer so that a surface of the passivation layer 260 is substantially flat.

A first electrode 265 is formed on the passivation layer 260 in the emission region EA of each pixel region P, and is connected to the second drain electrode 236b through the drain contact hole 263.

The first electrode 265 may be made of a transparent conductive material having a relative high work function, for example, ITO (indium tin oxide) so that the first electrode 265 functions as an anode. Alternatively, the first electrode 265 made be made of a metal material having a relative low work function, for example, at least one of aluminum (Al), aluminum-neodymium alloy (AlNd), silver (Ag), magnesium (Mg), gold (Au), and aluminum-magnesium alloy (AlMg) so that the first electrode 265 functions as a cathode.

A bank 267 is formed on the first electrode 265 and at a boundary of the emission region EA. The bank 267 surrounds the emission region EA, overlaps edge portions of the first electrode 265, and exposes a center portion of the first electrode 265.

The bank 267 may be made of a transparent organic insulating material, for example, polyimide, or a black organic insulating material, for example, black resin.

An organic light emission layer 270 is formed on the first electrode 267 at the emission region EA surrounded by the bank 267. A second electrode 273 is formed on the organic light emission layer 270 and the bank 267 and entirely over a display region.

The first and second electrodes 265 and 273, and the organic light emission layer 270 therebetween constitutes an organic light emitting diode E.

Even though not shown in the drawings, a first light emission compensation layer may be formed between the first electrode 265 and the organic light emission layer 270 and may have a single-layered or multiple-layered structure. Further, a second light emission compensation layer may be formed between the second electrode 273 and the organic light emission layer 270 and may have a single-layered or multiple-layered structure.

When the first electrode 265 functions as an anode, the first light emission compensation layer may have a multiple-layered structure that includes a hole injection layer and a hole transporting layer sequentially located on the first electrode 265, and the second light emission compensation layer may have a multiple-layered structure that includes an electron transporting layer and an electron injection layer sequentially located on the organic light emission layer 270.

Alternatively, the first light emission compensation layer may have a single-layered structure of a hole injection layer or hole transporting layer, and the second light emission compensation layer may have a single-layered structure of an electron injection layer or electron transporting layer.

The first light emission compensation layer may further include an electron blocking layer, and the second light emission compensation layer may further include a hole blocking layer.

When the first electrode 265 functions as a cathode, the above positions of the first light emission compensation layer and the second light emission compensation layer change.

When the first electrode 265 functions as an anode, the second electrode 273 may be made of a metal material having a relative low work function, for example, at least one of aluminum (Al), aluminum-neodymium alloy (AlNd), silver (Ag), magnesium (Mg), gold (Au), and aluminum-magnesium alloy (AlMg) so that the second electrode 273 functions as a cathode. When the first electrode 265 functions as a cathode, the second electrode 273 may be made of a transparent conductive material having a relative high work function, for example, ITO so that the second electrode 273 functions as an anode.

The second substrate as an encapsulation substrate is employed to face the first substrate 201 having the above components.

The first substrate 201 and the second substrate may be attached to each other using an adhesive material made of sealant or frit to form an OELD panel, and the adhesive material are located along peripheral portions of the first substrate 201 and the second substrate. Further, a space between the first substrate 201 and the second substrate may be filled with a vacuum or inert gas.

The second substrate may be made of a plastic material having a flexibility, or a glass material.

Alternatively, the second substrate may be formed in a film type having an adhesive layer, and may contact the second electrode 273 on the first substrate 201.

Alternatively, a capping layer made of an organic insulating material or inorganic insulating material may be further formed on the second electrode 273, and in this case, the capping layer is used for an encapsulation layer and the second substrate for encapsulating may be eliminated.

As described above, the OELD 201 of the second embodiment uses the storage capacitor StgC that is configured to overlap at least one of the switching TFT STr and the driving TFT DTr. Accordingly, the OELD 201 does not need an extra region to form the storage capacitor StgC out of each element region DA.

Thus, an area of the element region DA in each pixel region P can be reduced, and, by utilizing a reduced area of the element region DA for the light emission region EA, an aperture ration can be improved.

Further, since the storage capacitor StgC can be formed all over the element region DA, a capacitance of the storage capacitor StgC can be obtained sufficiently.

Therefore, even though the OELD 201 has a high resolution of 300 PPI or more, degradation of display quality due to reduction of storage capacitance can be prevented.

Further, since the storage capacitor StgC overlaps the switching TFT STr and/or the driving TFT DTr, the storage capacitor StgC functions as a component to shield the first and/or second semiconductor layers 213 and/or 215 from an external light, and thus malfunction of the TFT(s) due to leakage current due to the external light entering the semiconductor layer(s) can be prevented.

Further, when the OELD 201 uses a flexible substrate, the moisture blocking layer 202 is employed. Accordingly, permeation of moisture and oxygen into the substrate can be prevented. Further, the storage capacitor StgC below the TFTs can also function as a shielding layer that shields an electric field caused by an static electricity occurring at the flexible substrate, thus a process of adding a shielding layer is not required, and thus manufacturing processes can be simplified.

It will be apparent to those skilled in the art that various modifications and variations can be made in a display device of the present invention without departing from the sprit or scope of the disclosure. Thus, it is intended that the present invention covers the modifications and variations of this disclosure provided they come within the scope of the appended claims and their equivalents.

What is claimed is:

1. An organic electroluminescent device (OELD) comprising:
    a first substrate including a pixel region that includes an element region and a light emission region;
    a storage capacitor disposed within the element region and outside the light emission region, and including a first storage electrode, a first buffer layer on the first storage electrode, and a second storage electrode on the first buffer layer;
    a second buffer layer on the storage capacitor;
    a plurality of TFTs on the second buffer layer within the element region; and
    a passivation layer on the plurality of TFTs,
    wherein the storage capacitor overlaps at least one of the plurality of TFTs.

2. The OELD of claim 1, further comprising a moisture blocking layer between the first substrate and the first storage electrode.

3. The OELD of claim 2, wherein the first substrate is a flexible substrate.

4. The OELD of claim 1, wherein the first and second storage electrodes are each made of a metal material, and the first buffer layer is made of an inorganic insulating material.

5. The OELD of claim 1, wherein the plurality of TFTs each includes:
    a semiconductor layer;
    a gate insulating layer on the semiconductor layer;
    a gate electrode on the gate insulating layer;
    an inter-layered insulating layer on the gate electrode, and including semiconductor contact holes exposing the semiconductor layer; and
    a source electrode and a drain electrode on the inter-layered insulating layer, and contacting the semiconductor layer through the corresponding semiconductor contact holes.

6. The OELD of claim 5, wherein the plurality of TFTs includes a switching TFT and a driving TFT, and
    wherein the storage capacitor overlaps at least one of the switching TFT and the driving TFT.

7. The OELD of claim 6, further comprising a first auxiliary pattern on the inter-layered insulating layer,
    wherein the first auxiliary pattern is connected to the drain electrode of the switching TFT, the gate electrode of the driving TFT, and the storage capacitor.

8. The OELD of claim 7, wherein the first auxiliary pattern is connected to the second storage electrode through a storage contact hole that is formed in the inter-layered insulating layer, the gate insulating layer and the second buffer layer to expose the second storage electrode.

9. The OELD of claim 7, wherein the first auxiliary pattern is connected to the first storage electrode through a storage contact hole that is formed in the inter-layered insulating layer, the gate insulating layer, the second buffer layer and the first buffer layer to expose the first storage electrode.

10. The OELD of claim 7, wherein the first auxiliary pattern is connected to the gate electrode of the driving TFT through a gate contact hole that is formed in the inter-layered insulating layer to expose the gate electrode of the driving TFT.

11. The OELD of claim 6, further comprising an organic light emitting diode on the passivation layer at the light emission region,
    wherein the organic light emitting diode is connected to the drain electrode of the driving TFT through a drain contact hole that is formed in the passivation layer to expose the drain electrode of the driving TFT.

12. The OELD of claim 5, wherein the semiconductor layer is made of a poly silicon or oxide semiconductor material.

13. An organic electroluminescent device (OELD) comprising:
    a first substrate including a pixel region that includes an element region and a light emission region;
    a storage capacitor disposed at the element region, and including a first storage electrode, a first buffer layer on the first storage electrode, and a second storage electrode on the first buffer layer;
a second buffer layer on the storage capacitor;
a plurality of TFTs on the second buffer layer at the element region;
a passivation layer on the plurality of TFTs; and
a moisture blocking layer between the first substrate and the first storage electrode,
wherein the storage capacitor overlaps at least one of the plurality of TFTs.

14. An organic electroluminescent device (OELD) comprising:
a first substrate including a pixel region that includes an element region and a light emission region;
a storage capacitor disposed at the element region, and including a first storage electrode, a first buffer layer on the first storage electrode, and a second storage electrode on the first buffer layer;
a second buffer layer on the storage capacitor;
a plurality of TFTs on the second buffer layer at the element region; and
a passivation layer on the plurality of TFTs;
wherein the plurality of TFTs includes a switching TFT and a driving TFT, which each include a gate electrode, and a source electrode and a drain electrode on an inter-layered insulating layer,
wherein the storage capacitor overlaps at least one of the switching TFT and the driving TFT,
wherein a first auxiliary pattern is connected to the drain electrode of the switching TFT, the gate electrode of the driving TFT, and the storage capacitor.

15. The OELD of claim 14, wherein the first auxiliary pattern is connected to the second storage electrode through a storage contact hole that is formed in the inter-layered insulating layer and the second buffer layer to expose the second storage electrode.

16. The OELD of claim 14, wherein the first auxiliary pattern is connected to the first storage electrode through a storage contact hole that is formed in the inter-layered insulating layer, the second buffer layer and the first buffer layer to expose the first storage electrode.

17. The OELD of claim 14, wherein the first auxiliary pattern is connected to the gate electrode of the driving TFT through a gate contact hole that is formed in the inter-layered insulating layer to expose the gate electrode of the driving TFT.

* * * * *